US007879409B2

United States Patent

(12) United States Patent
Furuta et al.
(10) Patent No.: US 7,879,409 B2
(45) Date of Patent: Feb. 1, 2011

(54) REPEATABILITY OF CVD FILM DEPOSITION DURING SEQUENTIAL PROCESSING OF SUBSTRATES IN A DEPOSITION CHAMBER

(75) Inventors: Gaku Furuta, Sunnyvale, CA (US); Tae Kyung Won, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1844 days.

(21) Appl. No.: 10/898,472

(22) Filed: Jul. 23, 2004

(65) Prior Publication Data

US 2006/0019031 A1 Jan. 26, 2006

(51) Int. Cl.
*C08J 7/04* (2006.01)

(52) U.S. Cl. ....................... 427/489; 427/534; 427/563; 427/255.27; 427/255.28; 427/255.37

(58) Field of Classification Search ................ 427/489, 427/534, 563, 568, 255.27, 255.28, 255.37
See application file for complete search history.

(56) References Cited

U.S. PATENT DOCUMENTS 5,158,644 A 10/1992 Cheung et al. .............. 156/643
5,271,972 A 12/1993 Kwok et al. ................ 427/579
5,824,375 A * 10/1998 Gupta ........................ 427/569
6,020,035 A * 2/2000 Gupta et al. ................ 427/534
6,167,834 B1 1/2001 Wang et al. .............. 118/723 E
6,197,705 B1 3/2001 Vassiliev .................... 438/789
6,716,693 B1 4/2004 Chan et al. .................. 438/238
6,723,660 B1 4/2004 Ishida ........................ 438/758
6,777,347 B1 * 8/2004 Ni et al. ...................... 438/771
2002/0018862 A1 * 2/2002 Tsai et al. ................... 427/554
2003/0141820 A1 7/2003 White et al. ........... 315/111.21
2005/0189070 A1 * 9/2005 Tanaka et al. .......... 156/345.27
2005/0221020 A1 * 10/2005 Fukiage ...................... 427/569

OTHER PUBLICATIONS

L. J. Arias, Jr. et al., "Characterization of a low temperature, low pressure plasma enhanced chemical vapor deposition tetraethylorthosilicate oxide deposition process", J. Vac. Sci. Technol. A, vol. 15, No. 3, pp. 1389-1393 (1997).

(Continued)

*Primary Examiner*—Binh X Tran
(74) *Attorney, Agent, or Firm*—Shirley L. Church, Esq.

(57) ABSTRACT

We have a method of improving the deposition rate uniformity of the chemical vapor deposition (CVD) of films when a number of substrates are processed in series, sequentially in a deposition chamber. The method includes the plasma preheating of at least one processing volume structure within the processing volume which surrounds the substrate when the substrate is present in the deposition chamber. We also have a device-controlled method which adjusts the deposition time for a few substrates at the beginning of the processing of a number of substrates in series, sequentially in a deposition chamber, so that the deposited film thickness remains essentially constant during processing of the series of substrates. A combination of these methods into a single method provides the best overall results in terms of controlling average film thickness from substrate to substrate.

7 Claims, 7 Drawing Sheets

OTHER PUBLICATIONS

K. Fujino et al., "Silicon Dioxide Deposition by Atmospheric Pressure and Low-Temperature CVD Using TEOS and Ozone", J. Electrochem. Soc., vol. 137, No. 9, pp. 2883-2887 (Sep. 1990).

K. Fujino et al., "Dependence of Deposition Characteristics on Base Materials in TEOS and Ozone CVD at Atmospheric Pressure", J. Electrochem. Soc., vol. 138, No. 2, pp. 550-554 (Feb. 1991).

E. J. Kim et al., "Modeling of $SiO_2$ CVD From TEOS/Ozone in a Separate-Gas-Injection Reactor", Korean J. Chem. Eng., vol. 15, No. 1, pp. 56-63 (1998).

* cited by examiner

| x | y | SiO THICK (Å) | DR (Å/M) |
|---|---|---|---|
| 8 | 722 | 160 | 240 |
| 10 | 720 | 973 | 1450 |
| 12 | 718 | 1055 | 1582 |
| 14 | 716 | 1072 | 1008 |
| 17 | 713 | 1073 | 1609 |
| 20 | 710 | 1073 | 1610 |
| 25 | 705 | 1068 | 1601 |
| 35 | 695 | 1060 | 1590 |
| 50 | 680 | 1045 | 1568 |
| 85 | 655 | 1038 | 1557 |
| 115 | 630 | 1029 | 1544 |
| 160 | 580 | 1026 | 1539 |
| 190 | 530 | 1030 | 1546 |
| 210 | 480 | 1037 | 1556 |
| 245 | 425 | 1049 | 1574 |
| 290 | 370 | 1065 | 1598 |
| 330 | 320 | 1072 | 1608 |
| 360 | 275 | 1056 | 1584 |
| 560 | 455 | 1048 | 1571 |
| 590 | 410 | 1060 | 1590 |
| 630 | 360 | 1058 | 1587 |
| 675 | 305 | 1040 | 1560 |
| 710 | 250 | 1028 | 1542 |
| 730 | 200 | 1025 | 1537 |
| 760 | 150 | 1023 | 1534 |
| 805 | 100 | 1026 | 1538 |
| 835 | 75 | 1034 | 1551 |
| 870 | 50 | 1042 | 1563 |
| 885 | 35 | 1051 | 1577 |
| 895 | 25 | 1061 | 1501 |
| 900 | 20 | 1067 | 1600 |
| 903 | 17 | 1073 | 1610 |
| 906 | 14 | 1078 | 1618 |
| 908 | 12 | 1080 | 1620 |
| 910 | 10 | 1071 | 1606 |
| 912 | 8 | 1019 | 1529 |

| x | y | SiO THICK (Å) | DR (Å/M) |
|---|---|---|---|
| 8 | 8 | 1000 | 1500 |
| 10 | 10 | 1058 | 1587 |
| 12 | 12 | 1076 | 1614 |
| 14 | 14 | 1080 | 1620 |
| 17 | 17 | 1076 | 1614 |
| 20 | 20 | 1073 | 1610 |
| 25 | 25 | 1066 | 1599 |
| 35 | 35 | 1051 | 1577 |
| 50 | 50 | 1041 | 1582 |
| 75 | 85 | 1034 | 1551 |
| 100 | 115 | 1033 | 1550 |
| 150 | 160 | 1028 | 1543 |
| 200 | 190 | 1032 | 1549 |
| 250 | 210 | 1037 | 1555 |
| 305 | 245 | 1044 | 1566 |
| 360 | 200 | 1061 | 1592 |
| 410 | 330 | 1094 | 1641 |
| 455 | 360 | 1112 | 1668 |
| 465 | 370 | 1114 | 1671 |
| 510 | 400 | 1091 | 1636 |
| 560 | 440 | 1052 | 1578 |
| 615 | 485 | 1034 | 1551 |
| 670 | 520 | 1026 | 1539 |
| 720 | 540 | 1023 | 1534 |
| 770 | 570 | 1018 | 1528 |
| 820 | 615 | 1031 | 1547 |
| 845 | 645 | 1045 | 1568 |
| 870 | 680 | 1055 | 1583 |
| 885 | 695 | 1065 | 1598 |
| 895 | 705 | 1079 | 1619 |
| 900 | 710 | 1088 | 1632 |
| 903 | 713 | 1093 | 1640 |
| 906 | 716 | 1095 | 1643 |
| 908 | 718 | 1079 | 1619 |
| 910 | 720 | 1037 | 1555 |
| 912 | 722 | 871 | 1307 |

420

ADJUSMENT TO DEPOSITION TIME BASED ON
SUBSTRATE RUN NUMBER IN A SERIES OF SUBSTRATE
TEOS-BASED $SiO_X$ PECVD
AKT™ 5500 PROCESSING CHAMBER

| RUN No. | 1 | 2 | 3 | 4 | 5 | 6 | 7 | 8 | 9 | 10 | UNIF. |
|---|---|---|---|---|---|---|---|---|---|---|---|
| FACTOR | 1.051 | 1.031 | 1.020 | 1.012 | 1.006 | 1.001 | 1.001 | 1.001 | 1.001 | 1.001 | 2.4% |
| DEPO RATE (nm/min) | 1631 | 1663 | 1681 | 1689 | 1704 | 1715 | 1709 | 1718 | 1714 | 1714 | 2.6% |
| DEPO TIME (SEC.) | 36.79 | 36.09 | 35.70 | 35.42 | 35.21 | 35.04 | 35.04 | 35.04 | 35.04 | 35.04 | 2.4% |
| THICK. WITH ADJUST. (nm) | 1000 | 1000 | 1000 | 997 | 1000 | 1002 | 998 | 1003 | 1001 | 1001 | 0.3% |
| THICK. WITHOUT ADJUST. (nm) | 951 | 970 | 980 | 985 | 994 | 1000 | 997 | 1002 | 1000 | 1000 | 0.3% |
| FITTED DEPO RATE (nm/min) | 1630 | 1662 | 1680 | 1693 | 1703 | 1712 | 1712 | 1712 | 1712 | 1712 | 2.4% |

* MEASURED DATA FROM THE TEST

1. TO OBTAIN A 1000 nm THICK FILM, THE DEPOSITION TIME IS ADJUSTED OUT THROUGH RUN No. 5.
2. THE REPRESENTATIVE ALGORITHM IS:
   DEPOSITION TIME FOR RUN No. X =

$$\frac{C3}{C1 \times \ln(X) + C2} \quad \} 422$$

WHERE: C1 = 45.42 nm/min
C2 = 1631 nm/min
C3 = 1714 nm/min
X IS THE RUN No. IN A SERIES OF SEQUENTIAL SUBSTRATE PROCESSING RUN No.S

*Fig. 4B*

REPEATABILITY OF CVD FILM DEPOSITION DURING SEQUENTIAL PROCESSING OF SUBSTRATES IN A DEPOSITION CHAMBER

BACKGROUND OF THE INVENTION

1. Field of the Invention

This invention relates generally to the field of chemical vapor deposition for the manufacturing of articles including thin layers of silicon oxide. Particularly, this invention relates to methods and apparatus for controlling the deposition of silicon oxide layers/films upon a series of substrates processed in sequence in the same processing chamber.

2. Brief Description of the Background Art

Chemical vapor deposition (CVD) is a process of forming a film on a substrate, typically, by generating vapors from liquid or solid precursors and delivering those vapors to the (typically heated) surface of a substrate where the vapors react to form a film. Systems for chemical vapor deposition are employed in applications such as semiconductor fabrication, where CVD is employed to form thin films of semiconductors, dielectrics and metal layers. Plasma enhanced chemical vapor deposition (PECVD) is the most common deposition method used to obtain device-quality TEOS-based silicon oxide ($SiO_x$) films. In the current state of the art, for a series of substrates processed sequentially in a single chamber, the TEOS-based silicon oxide deposition rate gradually increases for each subsequent substrate processing, because of changes in the PECVD reactor chamber which occur from substrate to substrate. The lack of a uniform deposition rate during processing of a series of substrates has a negative affect in terms of device performance and/or process yield. To accommodate a potential variation in deposited film thickness, the device design is negatively impacted. Substantial limitations have to be made to the device design.

By way of example, when the substrate is a device such as a thin-film transistor, where the gate insulator film thickness is critical, or a diode, a variation in thickness of a deposited film substantially affects design performance. In such instances, changes in the deposition rate for substrates processed in sequence in a single chamber may quickly breach narrow tolerance limits for the deposited film thickness. One factor which helps improve the consistency of film deposition rate, and in turn thickness repeatability from one processed substrate to the next, is frequent cleaning of the PECVD reaction chamber. During substrate processing, the deposition material attaches to the inner walls and other areas of the reaction chamber, thereby affecting subsequent processing variables. A number of methods for cleaning this deposited material from within a reaction chamber exist, including both wet cleaning and dry cleaning. In wet cleaning, the reaction chamber is opened and the chamber surfaces are cleaned manually. Manual cleaning is very time consuming, negatively affecting substrate processing throughput. Dry cleaning methods are an improvement over wet cleaning methods because dry-cleaning is an in-situ cleaning process that does not require disassembly of the reaction chamber. Typically dry cleaning is used frequently with wet cleaning applied only as necessary.

Numerous examples of process chamber dry cleaning methods exist in the current state of the art, including U.S. Pat. Nos. 5,753,137 and 5,158,644 both assigned to the assignee of the current invention and generally relating to methods for reacting a cleaning species with the contaminant within the reaction chamber to produce a gaseous reaction product which is easily removed from the chamber. Other methods to reduce cleaning frequency requirements include coating the chamber walls with a carbon material that will protect the chamber walls from chemical attack by a reactant processing gas (U.S. Pat. No. 5,085,727); and adding a sacrificial structure to the chamber which prevents polymer build-up within said chamber (U.S. Pat. No. 4,786,359). Frequent remedial cleanings of the substrate processing chamber following a substrate processing will reduce behavioral changes within the processing chamber.

However, even when process chamber surfaces are maintained in a cleaned condition, there are still significant variations in film deposition rate for PECVD deposited films when a series of substrates are processed in sequence in a process chamber. Other process variables affect the film deposition rate during processing of a series of substrates in sequence.

To achieve a reasonable product yield, where the deposited film thickness is held relatively constant, those skilled in the art have resorted to manual adjustment of the deposition time for each substrate processed. This is very labor intensive and subject to error.

It is well known that within a reaction chamber the deposition rate of a source gas is a function of many variables, at least including pressure, gas composition, power, time and temperature. (See e.g., Kim, E J, Gill, W N, Modeling of $SiO_2$ CVD From TEOS/Ozone in a Separate Gas-Injection Reactor, Korean J. Chem. Eng., 15(1), 56-63 (1998) and references therein.). Many methods for controlling deposition rate variability provide materials and methods to control these variables. In general, these methods provide a chemical atmosphere within the reaction chamber that acts to off-set any negative affect caused by deposition material build-up. One example is U.S. Pat. No. 6,723,660 B1 describing a method for reducing the variation of source gas deposition rate to form thin films of a stable thickness by controlling pressure within the reaction chamber during substrate processing. This patent describes how an increase in the temperature of the source gas distribution mechanism (shower head) causes a change in the property of the source gas being deposited onto a substrate. The reference states that the addition of a temperature control device to the reaction chamber to prevent the increase in temperature of the shower head is not feasible, because the complex mechanics of such a temperature control device will negatively affect the delivery of said source gas. Thus, the method of the '660 patent is to counter the increasing showerhead temperature by adjusting the pressure within the processing chamber, thereby stabilizing the deposition rate, to decrease variations in substrate processing. However, this method is limited in that Chemical Vapor Deposition techniques are very sensitive to pressure changes, thus there is only a narrow range of adjustments that can be made in pressure to off-set variability in deposition rate.

Thus there is a need in the art to provide a more consistent reaction chamber environment allowing for a uniform PECVD deposition rate of films during processing of a series of substrates in sequence in a process chamber. In addition there is a need in the art for improved substrate throughput during PECVD deposition of films in the semiconductor industry.

SUMMARY OF THE INVENTION

We have discovered a method of improving the repeatability of the deposition rate of chemical vapor deposition (CVD) films, and particularly plasma enhanced chemical vapor deposition (PECVD) films, when a number of substrates are processed in series, sequentially in a deposition chamber. We have also been able to improve the uniformity of the deposited film across large substrates. In addition to improving the repeatability of film deposition rate, we have developed a device-controlled method of adjusting the film deposition time during processing of a series of substrates in sequence, so that the film thickness deposited is consistent from substrate to substrate. A combination of the repeatable deposition rate with deposition time adjustment has enabled a large increase in the number of substrates which may be processed prior to cleaning the film deposition chamber, while providing increased control over film thickness and uniformity of the deposited film. The method enables processing of at least 10 substrates, and typically substantially more than 10 in series prior to cleaning of the deposition chamber. One of the most important aspects of the method is the provision of more constant thermal conditions under which the depositing film is formed. The method avoids or reduces the possibility that the first series of substrates processed after cleaning of the process chamber will fail to meet film thickness and uniformity requirements for the CVD-deposited film. By cleaning of the process chamber it is meant either wet cleaning or cleaning with a chemically reactive plasma. With respect to PECVD-deposited silicon oxide films, such a chemically reactive cleaning plasma would be an $NF_3$ plasma, for example.

The method of improving the consistency of chemical vapor deposition rate and thickness uniformity across a substrate of a film deposited by chemical vapor deposition, for a series of substrates processed in sequence in a deposition chamber comprises: pre-heating a platform on which a substrate resides within the deposition chamber; and pre-heating at least one processing volume structure within the processing chamber volume which surrounds the substrate when the substrate is present on the substrate support platform. Typically the at least one processing volume structure is selected from the group consisting of side wall structures and structures which overlie the substrate when the substrate is present in the processing chamber (such as a gas distribution plate), wherein said preheating of the at least one structure within the process volume is achieved using physical bombardment by plasma species. Typically the plasma species are essentially chemically inert; however, in particular instances the plasma species may comprise reactive species.

Optionally, the substrate which is placed on the substrate support platform may be pre-heated prior to placement on the platform. Also optionally, the upper surface of the substrate may be heated in place on the platform by physical bombardment with plasma species. In the instance when the substrate upper surface is plasma heated in place on the platform, the plasma used to do the physical bombardment of the substrate surface heating is selected to reduce potential harm to the substrate surface. This may require the use of a non-inert plasma species. For example, we have discovered that use of an argon plasma to bombard a silicon, polysilicon, or amorphous silicon substrate surface negatively affects the interface which is subsequently formed upon deposition of a silicon oxide dielectric layer on that surface. To avoid such interfacial damage, an oxygen-comprising plasma may be used to provide species for physical bombardment heating of the substrate surface.

Since the process chamber volume structures require periodic heating (which may simultaneously provide some cleaning) by plasma treatment during processing of a series of substrates, the plasma treatment of the process chamber volume structures for heating, and the heating of a substrate surface may be conducted simultaneously.

It is advantageous when the plasma which is used to heat the processing volume structures simultaneously removes residual film deposition byproducts which accumulated on the processing volume structures during film deposition upon a previously processed substrate. To describe this, we refer to a heating/cleaning of the processing volume structures. Typically, but optionally, the process volume structure preheating is carried out prior to loading the substrate into the processing chamber. This is to prevent contamination of the substrate during the preheating process.

A first embodiment of the method of the invention is related to obtaining a consistent film deposition rate by controlling the thermal environment in which the film is deposited requires the availability of a plasma within the film deposition chamber, where the processing chamber either produces a plasma internally within the chamber or imports a remotely generated plasma. However, in some instances it is an advantage when the plasma is generated within the chamber, as the percentage of the plasma which is in the form of ions or is at a higher energy level at the time of contact with processing volume surfaces is increased.

A second embodiment of the method of the invention related to obtaining a consistent film thickness requires the availability of a control system for adjusting the film deposition time for a portion of the substrates in a series of substrates processed in sequence.

The best results (in terms of obtaining a constant film thickness across the substrate surface for a series of substrates processed sequentially) are obtained by a method which combines both control of the thermal environment for all of the substrates processed, and adjustment of the film deposition time for a portion of the substrates. Typically both the thermal environment and the film deposition time are controlled for the first few substrates processed, with control of the thermal environment and a constant deposition time being adequate for the remainder of the substrates processed in the series.

The upper processing volume surface in the processing chamber may be an anode of a parallel plate PECVD apparatus. The anode is frequently a gas distribution plate through which the gases used to deposit the film flow. The platform on which the substrate resides during PECVD film deposition may be a cathode. As previously mentioned, the anode and cathode of the PECVD deposition chamber may be used to create a plasma in the processing chamber which is used to preheat the processing volume of the process chamber, while cleaning chamber surfaces in many instances.

Since the plasma increases the temperature of the processing volume structures by impacting the surface of the structures, these structures need to be constructed from materials which are easily heated in this manner and which do not produce harmful particulate contamination due to the contact with the plasma. For example, when the processing chamber is aluminum, a liner is typically used adjacent to the aluminum, and it is the liner which is heated by bombardment with high energy species (although a protective coating may be applied directly to the surface of a processing chamber or component). The liner or protective coating is typically constructed from materials such as ceramic or aluminum with an anodized coating or other ceramic coating applied over the aluminum surface.

For the above recited method of improving consistency of film deposition rate and thickness uniformity across a substrate of a film deposited by chemical vapor deposition, one of ordinary skill in the art, in view of the present disclosure, may use a number of different techniques to control the thermal environment in the area of the substrate surface. By way of example only, and not limitation, the substrate may be preheated prior to transfer into the processing chamber. In the alternative, the substrate upper surface may be pre-heated by plasma treatment while the lower surface of the substrate is pre-heated by heat transfer from the support platform. (The substrate may be biased by applying power to the platform on which the substrate resides, to attract ions toward the substrate.) In another alternative, the substrate may be pre-heated solely by heat transfer from the support platform.

The film deposition chamber may be a CVD chamber where a plasma is supplied from a remote plasma generation source only for preheating of chamber processing volume surfaces or for preheating and simultaneous cleaning in the manner described herein. In the alternative, the film deposition chamber may be a PECVD chamber where the plasma is generated internally or supplied from a remote plasma generation source and the plasma is used for preheating of chamber processing volume surfaces. In either of these cases, the substrate support platform is one capable of transferring heat to the substrate. Those of ordinary skill in the art will adjust the apparatus used to accomplish the method in view of the present disclosure.

BRIEF DESCRIPTION OF THE DRAWINGS

FIG. 4B is a table 420 showing supporting data for the graph shown in FIG. 4B. Based on the data obtained empirically, a representative algorithm 422 was developed which may be used to set the deposition time period for a series of sequentially processed substrates when PECVD deposition of a $SiO_x$ film is carried out using a TEOS precursor. This representative algorithm is programmed into a control system used to control the film deposition time for, typically and not by way of limitation, the first 5 substrates processed in the series.

DETAILED DESCRIPTION OF THE INVENTION

Figure 1A:
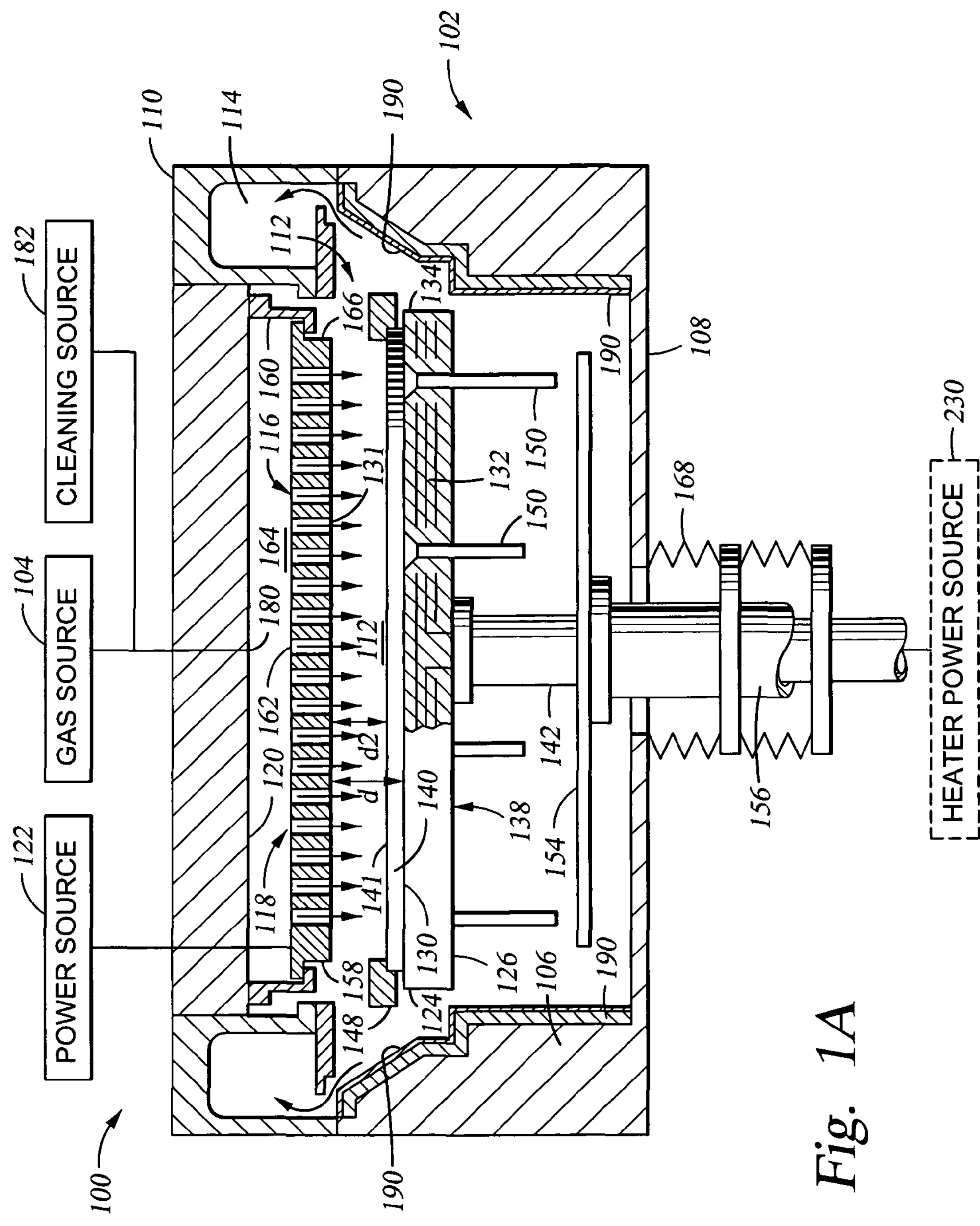
FIG. 1A is a schematic illustration in cross section of a processing chamber of the kind which is useful for PECVD deposition of films.

One of the embodiments of the present invention, where a $SiO_x$ film is deposited by PECVD using a TEOS precursor, is described in detail below as a means of describing the concept of the invention and illustrating particularly important features of the invention. After reading the present disclosure, the importance of the use of plasma pre-heating of substrate processing volume surfaces within a CVD or PECVD processing chamber will be understood by one skilled in the art. Further, the development of an empirical relationship between film deposition rate and the substrate number in a series of sequentially processed substrates will permit development of a representative algorithm which can be used to provide software-controlled deposition time periods. A combination of the plasma pre-heating of substrate volume with the use of software to control the deposition time periods for the first few substrates until the process window evens out provides the best control over deposited film thickness and film uniformity across the substrate.

The processing apparatus used to generate the data pertaining to the exemplary illustrations disclosed subsequently was an AKT 5500-PX, which is a PECVD reaction chamber available from Applied Materials, Inc. of Santa Clara, Calif. This example processing platform is useful for the application of Low Temperature Polysilicon PECVD technology to manufacture TFT-LCDs, for example and not by way of limitation. This processing platform is exemplary only and the use of other CVD and PECVD processing apparatus to deposit films for various applications is contemplated by the inventors. Applicants' invention will be beneficial in achieving a more consistent film deposition rate and a more uniform film deposition over the substrate surface when applied to film deposition in other AKT CVD processing chambers and in other CVD and PECVD film deposition apparatus known in the industry.

An Exemplary Substrate Processing Apparatus

The embodiment example PECVD processes described herein were carried out in a parallel plate processing chamber, the AKT™ PECVD 25 KA System, available from AKT™, a division of Applied Materials, Inc., Santa Clara, Calif. The system 100 generally includes a processing chamber 102 coupled to a gas source 104. The processing chamber 102 has walls 106 and a bottom 108 that partially define a process volume 112. The process volume 112 is typically accessed through a port (not shown) in the walls 106 that facilitate movement of a substrate 140 into and out of processing chamber 102. The walls 106 support a lid assembly 110 that contains a pumping plenum 114 that couples the process volume 112 to an exhaust port (that includes various pumping components, not shown).

A temperature controlled substrate support assembly 138 is centrally disposed within the processing chamber 102. The support assembly 138 supports the glass (for example, but not by way of limitation) substrate 140 during processing. The substrate support assembly 138 typically encapsulates at least one embedded heater 132, such as a resistive element, which element is coupled to a power source 130 which is used to heat embedded heater elements 132 and controllably heats the support assembly 138 and the substrate 140 positioned thereon. Typically, in a CVD process, the heater maintains the substrate 140 at a uniform temperature between about 120° C. and 460° C., depending on the processing parameters of the substrate.

Generally, the support assembly 138 has a lower side 126 and an upper side 134. The upper side 134 supports the glass substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the processing chamber 102. The stem 142 additionally provides a conduit for electrical and thermocouple leads between the support assembly 138 and other components of the system 100.

The support assembly 138 is generally grounded such that RF power supplied by a power source 122 to a gas distribution plate assembly 118 positioned between the lid assembly 110 and the substrate support assembly 138 (or other electrode positioned within or near the lid assembly of the chamber) may excite gases present in the process volume 112 between the support assembly 138 and the distribution plate assembly 118. The RF power from the power source 122 is generally selected commensurate with the size of the substrate, to drive the chemical vapor deposition process. The distance "d" illustrates the spacing between the upper surface 134 of substrate support assembly 138 and the lower surface 131 of distribution plate assembly 118. The spacing "d" in combination with the thickness of the substrate 140 substantially determines the processing volume 112. The spacing "d" can be adjusted as necessary to provide the desired processing conditions.

The lid assembly 110 typically includes an entry port 180 through which process gases provided by the gas source 104 are introduced into processing chamber 102. The entry port 180 is also coupled to a cleaning source 182. The cleaning source 182 typically provides a cleaning agent, such as disassociated fluorine, that is introduced into the processing chamber 102 to remove deposition by-products and films from processing chamber hardware.

The gas distribution plate assembly 118 is coupled to an interior side 120 of the lid assembly 110. The gas distribution plate assembly 118 is typically configured to substantially follow the profile of the substrate 140, for example, polygonal for large area substrates and circular for wafers. The gas distribution plate assembly 118 includes a perforated area 116 through which process and other gases supplied from the gas source 104 are delivered to the process volume 112. The perforated area 116 of the gas distribution plate assembly 118 is configured to provide uniform distribution of gases passing through the gas distribution plate assembly 118 into the processing chamber 102.

The gas distribution plate assembly 118 typically includes a diffuser plate 158 suspended from a hanger plate 160. The diffuser plate 158 and hanger plate 160 may alternatively comprise a single unitary member. A plurality of gas passages 162 are formed through the diffuser plate 158 to allow a predetermined distribution of a precursor source gas passing through the gas distribution plate assembly 118 and into the process volume 112. The hanger plate 160 maintains the diffuser plate 158 and the interior surface 120 of the lid assembly in a spaced-apart relation, thus defining a plenum 164 therebetween. The plenum 164 allows gases flowing through the lid assembly 110 to uniformly distribute across the width of the diffuser plate 158 so that gas is provided uniformly above the center perforated area 116 and flows with a uniform distribution through gas passages 162.

To enable use of the present invention while protecting internal surfaces of the process chamber in the area of processing volume 112, it is typically necessary to make use of a process chamber liner 190 to protect what is typically an aluminum process chamber wall 106. The chamber liner 190 is typically constructed from a ceramic material or aluminum coated with a ceramic material, such as aluminum oxide, not by way of limitation. The liner is typically resistant to bombardment by active species (such as ions) of essentially inert gases such as argon, neon, krypton, xenon, helium, nitrogen (depending on the substrate being processed) and combinations thereof. In addition, in some instances where it is advantageous to the surfaces being heated by contact with the plasma, the plasma may include a reactive species which is beneficial to the surface which is being heated. In addition, the surface 131 of gas distribution plate 118 which forms an interior surface of processing volume 112 may be bare aluminum (with a native oxide coating) or may be anodized aluminum. Other coatings may be applied to the aluminum surface, but such coatings must not provide a source of contamination of the substrate to which the CVD coating/film is being applied. Shadow ring 148, which protects the upper surface 134 of substrate support assembly 138 is also formed from a plasma resistant material such as a ceramic or a metal such as aluminum, which is coated with a plasma resistant coating of the kind previously mentioned with respect to gas distribution plate 118.

Exemplary Embodiment of the Method of the Invention

Applicants' have discovered that pre-heating of processing volume structures (which surround the substrate) prior to CVD film deposition on a substrate improves consistency of chemical vapor deposition rate when a series of substrates are processed sequentially in a processing chamber. The film thickness uniformity across a substrate is also improved. Preheating of processing volume structures is typically carried out by contacting the processing volume structures with a plasma which is not chemically reactive, but which provides high energy species for physical bombardment of the processing volume structures to be heated. Such structures include the process chamber liner 190, the lower surface 131 of gas distribution plate 118, and the surface of shadow ring 148, as previously discussed with reference to the processing chamber 102.

Typically the plasma is generated from a source gas such as argon, nitrogen, helium or combinations thereof, and is useful for both bringing the processing control volume 112 of the chamber 102 to a desirable temperature and for maintaining a stable temperature within the processing control volume 112 during a series of substrate processing runs, thereby providing a more uniform deposition rate and in turn a more uniform film deposition thickness post processing.

Figure 1B:
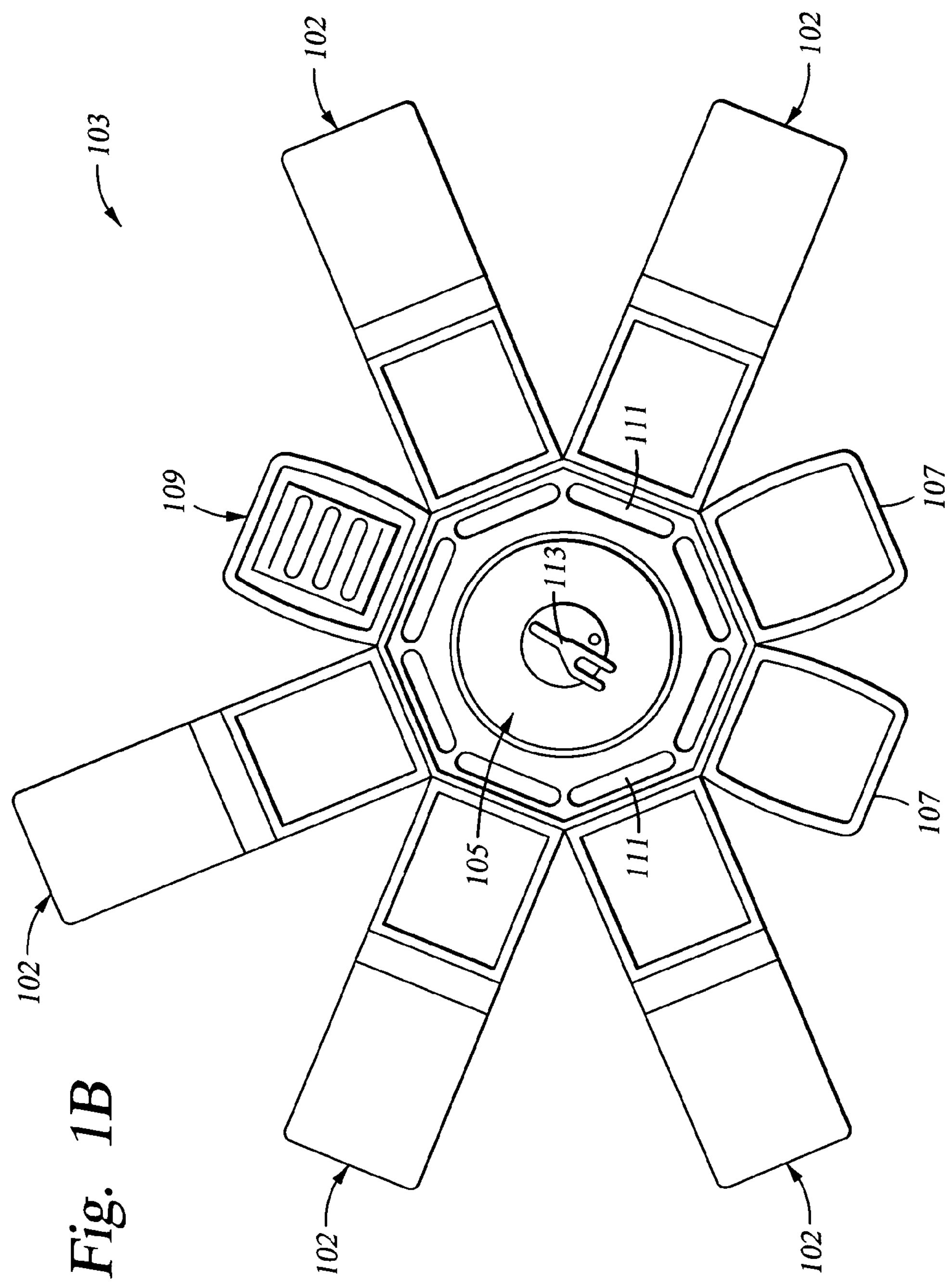
FIG. 1B is a schematic of a multi-chambered processing system which employs a process chamber of the kind illustrated in FIG. 1A.

FIG. 1B shows a schematic of a multi-chambered processing system 103, which employs a PECVD film deposition process chamber 100 of the kind illustrated in FIG. 1A. A substrate 140 may be heated in advance in an optional heating chamber 109, shown in FIG. 1B; or in one alternative, the substrate may be pre-heated in a load lock chamber 107 by pressure cycling, using a technique known in the industry. In another alternative, the substrate is not pre-heated until it is on the support platform 138 (FIG. 1A); however, this additional heating load in the processing chamber 102 lengthens the time required to heat the substrate and the process volume structures. The optionally heated substrate is transferred using a robot 113 located in a central substrate transferring chamber 105 into the PECVD film deposition process chamber 102 into processing volume 112 (FIG. 1A) of chamber 102 through a slit valve 111 in chamber wall 106 (FIG. 1A). The substrate 140 is placed on the upper surface 134 of a pre-heated substrate platform 138 (hereinafter "platform 138") and is hydraulically raised within processing chamber volume 112 by telescoping shaft member 156 (hereinafter "shaft 156"). A spacing "d" is created between the upper surface 134 of platform 138 and the lower surface 131 of gas distribution plate 118 (hereinafter "shower head 118" or "gas distribution plate/shower head 118"). The spacing "d" is adjusted to provided a secondary spacing "d2" between the upper surface 141 of the substrate 140 and the lower surface 131 of shower head 118. Platform 138 lifts a substrate so that the substrate spacing "d" between the upper surface 134 of platform 138 and the lower surface 131 of shower head 118 typically ranges between about 400 mils (milli-inch) and 1,500 mils. For this $SiO_x$ deposition from a TEOS precursor, the distance "d" was about 500 mils.

At least one heating element 132 heats platform 138 and a first substrate to the desired temperature for deposition of a CVD film upon the substrate. In the present exemplary embodiment, the CVD film is a silicon oxide ($SiO_x$) film deposited from a TEOS precursor. When the CVD film is TEOS-deposited $SiO_x$, a dual controlled set of heating elements 132 typically are used to heat platform 138 to about 390° C. on the interior, center area of the platform and about 410° C. around the exterior edge of the platform 138, which in turn compensates for loss of heat from the edge of substrate 140 and heats the substrate 140 to a uniform temperature ranging from about 365° C. and about 380° C. The dual heater is especially useful for large substrates where there is significant heat loss around the outer edge of the substrate.

In the exemplary embodiments, the substrates are TFT-LCDs, which are 730 mm by 920 mm in dimension, provide a surface area of 6,716 square centimeters which requires uniform processing. However, the method of the current invention is applicable to a variety of substrates of varying sizes just as said method is applicable to CVD and PECVD deposition of films other than $SiO_x$. These substrates, for the more advanced processing systems provide increased surface areas in the range of 12,000 square centimeters to 42,000 square centimeters (by way of example and not by way of limitation) which require uniform processing.

The exterior of deposition chamber 102 is heated to about 100° C. using a coil heater attached to the outer surface of deposition chamber 102. Typically, deposition chamber 102 is made of aluminum, which exhibits a high rate of heat transfer, heating the outer surface of deposition chamber 102 is useful for reducing heat loss from the chamber to ambient. However, as previously discussed herein, the temperature of the substrate during PECVD deposition of the $SiO_x$ film is in the range of about 370° C. As a result of the potential for heat loss into surrounding structures within the process chamber volume during deposition of the $SiO_x$ film, applicants developed the present invention to reduce the fluctuation in process chamber volume temperature during processing of a series of substrates sequentially within the process chamber.

One embodiment of applicants' invention provides for pre-heating of process volume structures such as process chamber liner 190, the lower surface 131 of showerhead 118, and shadow ring 148 prior to PECVD $SiO_x$ film deposition on the substrate. This, in combination with pre-heating of substrate 140 prior to its transfer into processing chamber 102, and pre-heating of platform 138, provides a more stable environment during the processing of substrates. However, in some instances, particularly where the substrate is not pre-heated prior to placement on platform 138, the first two to five substrates processed in a series of substrates exhibit a variable film deposition rate which does not meet requirements for repeatability desired for the deposition of thin layers of dielectric films in transistor and diode device applications. This is particularly a problem with respect to TFT flat panel display applications where the entire substrate may not be usable due to nonuniform thickness of a deposited oxide layer.

The plasma pre-heating of process volume structures typically raises the temperature of such structures to a temperature ranging from about 150° C. to about 300° C. The temperature which is achieved by plasma pre-heating will depend on the material from which the plasma volume structures are constructed and the plasma heating process conditions used. As previously described, the plasma used for pre-heating of plasma volume structures is typically generated from a plasma source gas which is essentially inert with respect to the surfaces being heated. Typically such a source gas is selected from the group consisting of argon, helium, nitrogen, xenon and combinations thereof, by way of example and not by way of limitation.

In the alternative, the substrate upper surface may be pre-heated in the processing chamber by plasma treatment while the lower surface of the substrate is pre-heated by heat transfer from the support platform. (The substrate may be biased by applying power to the platform on which the substrate resides, to attract ions toward the substrate.) In another alternative, the substrate may be pre-heated solely by heat transfer from the support platform. When the upper surface of the substrate is heated in place on the platform by bombardment with plasma species, the plasma used to heat the substrate surface is selected to reduce harm to the substrate surface. This may require the use of a non-inert plasma species. For example, we have discovered that use of an argon plasma to bombard a silicon or polysilicon or amorphous silicon substrate surface negatively affects the interface which is subsequently formed upon deposition of a silicon oxide dielectric layer on that surface. To avoid such interfacial damage, an oxygen-comprising plasma may be used to provide species for physical bombardment heating of the substrate. Since the process chamber volume structures require periodic heating/cleaning by plasma treatment during processing of a series of substrates, the plasma treatment of the process chamber volume structures for heating/cleaning, and the heating of the substrate surface may be conducted simultaneously.

The plasma source gas is supplied to the processing volume 112 of chamber 102 through at least one port connecting gas source 104, for example, through upper lid 110 and then through entry port 180, and finally through gas distribution plate/shower head 118.

To create the plasma used to heat the processing volume structures such as chamber liner 190 and surface 131 of showerhead 118, and shadow rings 148, radio frequency power (RF power) is applied to gas distribution plate/showerhead 118 by power source 122, typically at a frequency of 13.56 MHz and at a wattage ranging from about 100 W to about 7500 W in the AKT™ PECVD 5500 PX in which the exemplary embodiment substrates were processed. Power source 122, therefore, produces a power density ranging from about $1.5\times10^{-2}$ W/cm$^2$ to about 1.12 W/cm$^2$ on the surface 131 of showerhead 118 which serves as an anode in the plasma production process (where the shower head surface area very closely matches the substrate surface area, due to the need for a uniform plasma density over the entire substrate). Power to operate the heating elements 132 within grounded platform 138 is applied by power source 130, to raise the substrate temperature to about 370° C. Plasma source gas is introduced into the processing control volume 112 in the presence of these aforementioned conditions, and the plasma source gas is converted to high energy species, including ions, to form a plasma. The plasma in turn contacts surfaces surrounding the substrate processing volume 112, and heats at least one structure within the processing volume by physical bombardment with ions and other high energy species.

In a preferred embodiment of the current invention, where the substrate is not present in the film deposition processing chamber during heating of the processing volume structures, the plasma source gas was argon, since argon is the heaviest element of the gases mentioned and provides the most rapid heating by physical bombardment. The argon plasma source gas is introduced into processing volume 112 through a port connecting gas source 104 with the processing volume 112 at a flow rate ranging from about 1 standard-liters per minute (slm) to about 30 slm. For the data provided with reference to the experimental substrates, the flow rate of argon was set at 3 slm. For the first substrate processed, within about five minutes from the time the heating plasma was created, the processing volume structures were considered to be at a temperature acceptable for transferring a substrate into the processing chamber. The precise temperature of the processing volumes structures is not known, but the estimated temperature is in the range of about 250° C. to 300° C. For subsequent substrates processed, the plasma heat treatment of the processing volume structures was reduced to about one minute, as the temperature of the processing volume had been increased by processing of the first substrate. The pressure in processing volume 112 during plasma pre-heating of the plasma volume structures is typically in the range of about 100 mTorr to about 10 Torr. More typically, the pressure in the processing volume during plasma pre-heating ranges from about 1 Torr to about 3 Torr. The plasma produced typically has a density ranging from $1.5\times10^{-2}$ W/cm$^2$ to about 1.12 W/cm$^2$ as previously mentioned.

Not only does the physical bombardment of the processing volume structure surfaces increase the temperature of these surfaces, the increased surface temperature in combination with the reduced pressure conditions inside the processing chamber 102 enables the removal of at least a portion of the reaction byproducts which were left on processing volume structure surfaces during film deposition on previously processed substrates. This helps keep the processing chamber cleaner, so that a more constant amount of byproduct buildup is maintained on process chamber surfaces during the processing of a sequential series of substrates prior to chamber cleaning. Since the amount of byproduct buildup affects heat transfer, the pre-heating of process volume surfaces prior to CVD or PECVD film deposition helps maintain a more constant process volume temperature in two ways when a sequential series of substrates are processed between reactive plasma and/or wet cleaning of the process chamber.

A film forming gas mixture of tetraethylorthosilicate (TEOS), $O_2$ and Helium is then introduced into processing control volume 112 from gas source 104. In the exemplary embodiments, a plasma of these gases is formed and sustained using an RF power generator, typically at 13.56 MHz, where the power applied is in the range of 1000 W to 7500 W, to produce a plasma density on the substrate ranging from about 0.15 W/cm$^2$ to about 1.12 W/cm$^2$. The flow rates for the gases may range from about 100 to about 3000 sccm of TEOS, about 0 to about 2000 sccm of $He_2$ and about 1000 to about 30,000 sccm of $O_2$.

A $SiO_x$ film is deposited on substrate 140, produced from the gaseous precursors which flow from gas distribution plate/shower head 118. The source gases for the film enter a plasma above substrate 140 and active species from the plasma are adsorbed onto the surface 131 of the substrate 140 to form a film (not shown). By-products from the film forming step are desorbed from surface 131 of substrate 140. The rate of deposition of a TEOS film upon the substrate and the deposition processing time determine the thickness of said deposited film upon surface 131 of substrate 140. The deposition time for PECVD films can range from about 10 seconds to about 600 seconds, depending on the particular product requirements. Under economically desirable conditions, the deposition time for a thin film $SiO_x$ embodiment of the invention, where the film thickness is about 1000 Å, is about 30 seconds. An ellipsometer was used to measure film thicknesses in the current examples.

Following the deposition process, the first substrate is removed from processing control volume 112, and a subsequent pre-heated substrate is loaded into processing control volume 112 for processing. As will be illustrated subsequently herein, it is more advantageous in terms of deposition rate consistency from substrate to substrate to preheat the process volume surrounding structures prior to the loading of each new substrate in a series of substrates. However, pre-heating the process volume structures prior to processing of at least the first substrate or the first few substrates is helpful as well. One skilled in the art can balance the increased time expenditure for the pre-heating of the processing volume structures against the improvement in yield which is obtained due to a more consistent deposition rate during the sequential processing of a series of substrates. The amount of pre-heating time may be reduced after the first substrate is processed. For example, in one embodiment if the invention the processing volume chamber surrounding structures are pre-heated using Argon plasma for a 5 minute time period prior to loading of the first substrate. Subsequent pre-heating prior to substrate loading was reduced to 1 minute.

In an alternative embodiment, where the plasma treatment process time for pre-heating the plasma volume structures is consistently 1 minute, the density of the plasma used for preheating may be adjusted after the pre-heating process associated with the first substrate. For example, with respect to variables held constant, the gas flow rate for the argon used to generate the plasma was constant at about 3 slm and the power applied to power source 130 for application of heat to the substrate during film deposition was about 2.5 kW for the outer heating element, with two inner heating elements powered at about 1.25 kW each. The process chamber pressure was about 1.5 Torr. The power to the 122 power source used to generate the plasma ranged from 1200 to 1800 W during the pre-heating process for the plasma volume structures associated with the first substrate processed. Subsequently, the power to the 122 power source was reduced to about 600 W for pre-heating of the plasma volume structures associated with processing of each of the remaining substrates. The processing volume structures including chamber liner 190 and showerhead 118 were maintained at a temperature in the range of 250° to 300° C. during $SiO_x$ film deposition using this method.

EXAMPLES

Applicants evaluated argon, helium, and nitrogen as potential plasma source gases for their process volume structure heating process. Although each of these plasma source gases showed promise, the decision was made to use argon for the tests in which the longest sequential series (10 samples) of substrates was processed. The data presented herein is limited to these longer sequential series of substrate processing because it was determined that other process variables were affecting the data, and it was not possible to clearly see the trends in behavior of film deposition when only a few (3 samples) of substrates were processed in sequence. For example, the heating elements in the substrate platform 138 come on and off during processing of the substrates and the variation of input of heat from platform 138 affects the film deposition rate. The pattern of deposition rate change due to the heater cycling in the substrate platform 138 can be discounted when a larger number of substrates is processed in sequence, and the benefit of the preheating of processing volume structures becomes more apparent.

Examples 1-3

Figure 2A:
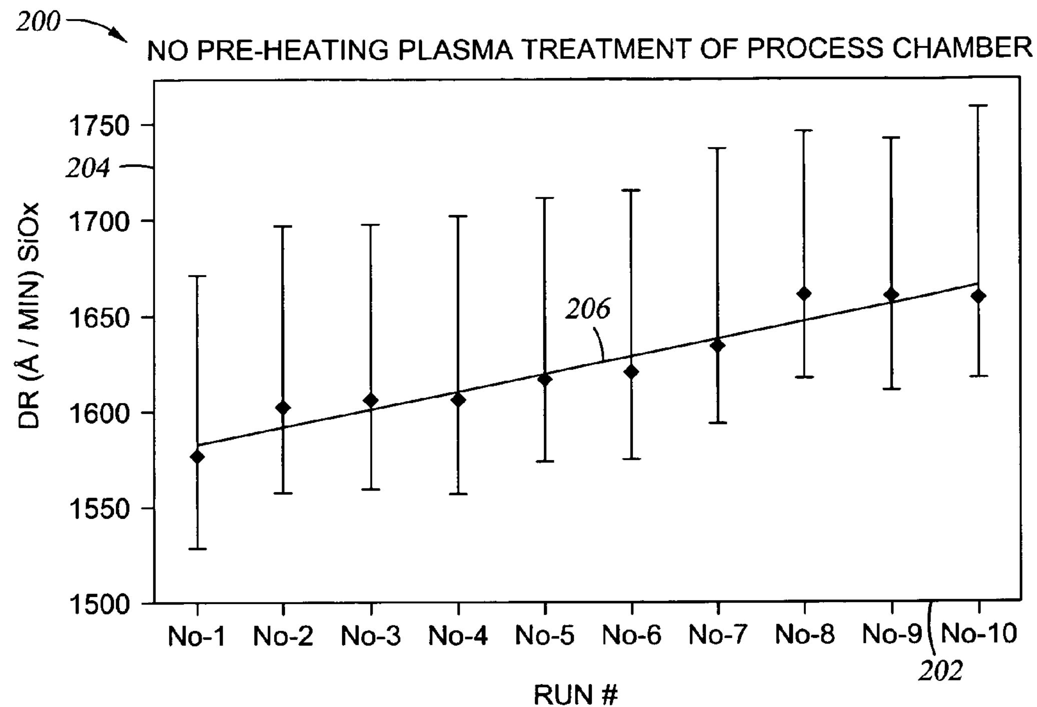
FIG. 2A is a graph showing the deposition rate in Å/min for an $SiO_x$ film deposited from a TEOS precursor, where a series of substrates were processed in sequence in the same PECVD process chamber, and where there was no plasma pre-heating treatment of the processing volume chamber surfaces.
Figure 2B:
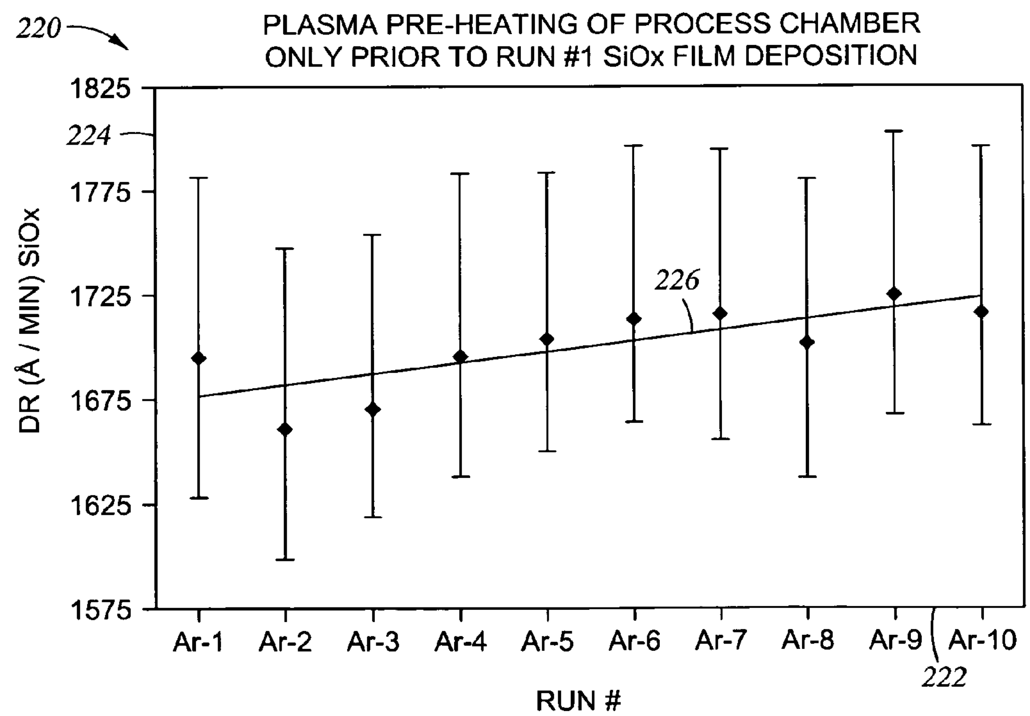
FIG. 2B is a graph showing the deposition rate in Å/min for a $SiO_x$ film deposited from a TEOS precursor, where a series of substrates were processed in sequence in the same PECVD processing chamber, and where there was a plasma pre-heating treatment of the processing volume chamber surfaces only prior to processing of the first substrate.
Figure 2C:
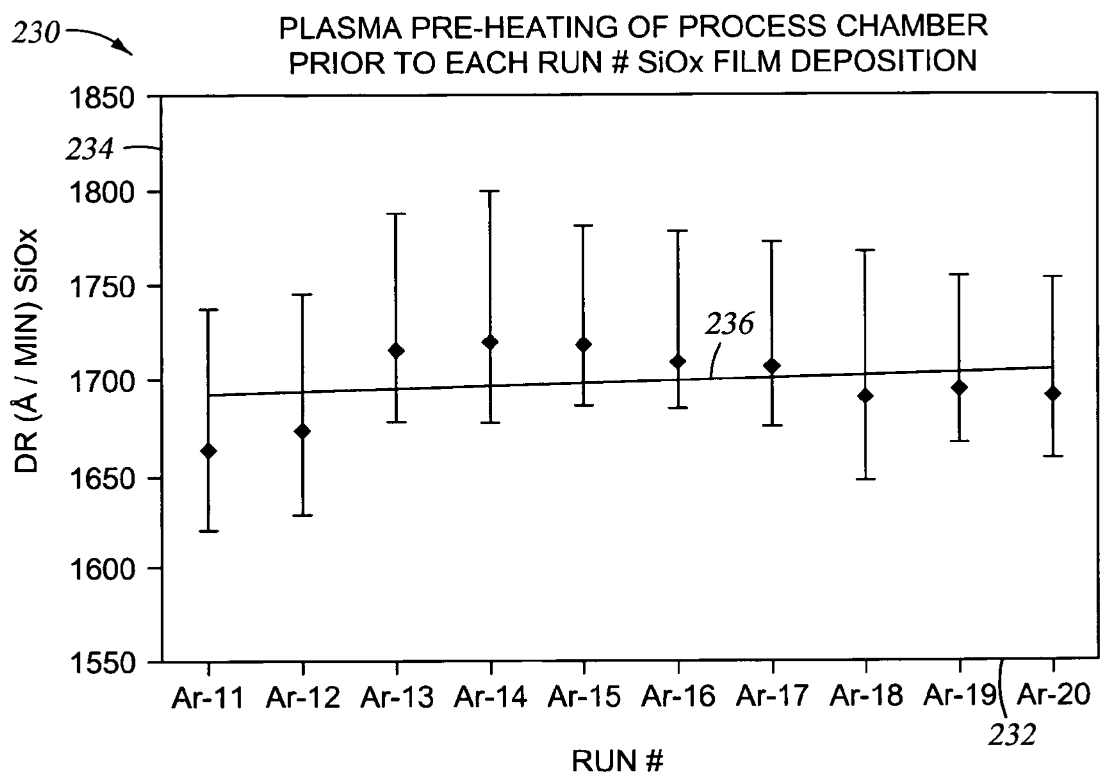
FIG. 2C is a graph showing the deposition rate in Å/min for a $SiO_x$ film deposited from a TEOS precursor, where a series of substrates were processed in sequence in the same PECVD processing chamber, and where there was a plasma pre-heating treatment of the processing volume chamber surfaces prior to the processing of each substrate.

FIGS. 2A, 2B, and 2C show a series of graphs illustrating deposition rate of PECVD deposited $SiO_x$ films as a function of the use of process volume surrounding structure pre-heating. FIG. 2A is a graph showing the deposition rate in Å/min for an $SiO_x$ film deposited from a TEOS precursor, where a series of ten substrates were processed in sequence in the same PECVD process chamber, and where there was no plasma pre-heating treatment of the processing volume chamber surfaces. FIG. 2B is a graph showing the deposition rate in Å/min for a $SiO_x$ film deposited from the same TEOS precursor, where a series of substrates were processed in sequence in the same PECVD processing chamber, under the same process conditions as those used during the FIG. 2A film depositions, except that there was a plasma pre-heating treatment of the processing volume chamber surfaces prior to processing of the first substrate only. FIG. 2C is a graph showing the deposition rate in Å/min for a $SiO_x$ film deposited from the same TEOS precursor, where a series of substrates were processed in sequence in the same PECVD processing chamber, and where there was a plasma pre-heating treatment of the processing volume chamber surfaces prior to the processing of each substrate.

This series of examples looks at differences in deposition rate of a $SiO_x$ film and the difference in film thickness across the substrate surface after numerous substrate processings in sequence without a reactive plasma cleaning step.

The PECVD deposition chamber was an AKT 5500PX chamber which was preconditioned (seasoned) prior to use. The preconditioning was carried out after a plasma cleaning using a remotely generated $NF_3$ plasma of the kind known in the art. The preconditioning included permitting the processing chamber to remain idle overnight, followed by flowing of TEOS over the chamber surface without a plasma at a flow rate of about 2300 sccm for 5 minutes. The support platform during seasoning was set at 390° C. inner heater temperature and 410° C. outer heater temperature. This seasoning was carried out only prior to processing of the first substrate after a $NF_3$ plasma cleaning of the PECVD film deposition chamber.

With reference to FIG. 2A, the ten substrates to which a $SiO_x$ film was applied by PECVD were processed without the benefit of any plasma pre-heating of the process volume surrounding structures. Each of the ten substrates was processed in sequence without any cleaning of the process chamber. The film deposition process conditions for each of the ten substrates were as follows: TEOS gas flow rate was 850 sccm, helium gas flow rate was 300 sccm, and oxygen flow rate was 10 slm. 2700 W of power was applied to the gas distribution plate 118 of the processing chamber 102. The pressure in the processing chamber during film deposition was 0.95 Torr. The spacing "d" between the upper surface 134 of platform 138 and the bottom surface 131 of gas distribution plate 118 was 470 mils (0.470 inches). The temperature of the interior heating element 132 of the platform 138 was 390° C., and the temperature of the exterior heating element (not shown) was 410° C. The film deposition time period for each substrate was 37 seconds.

Figure 3A:
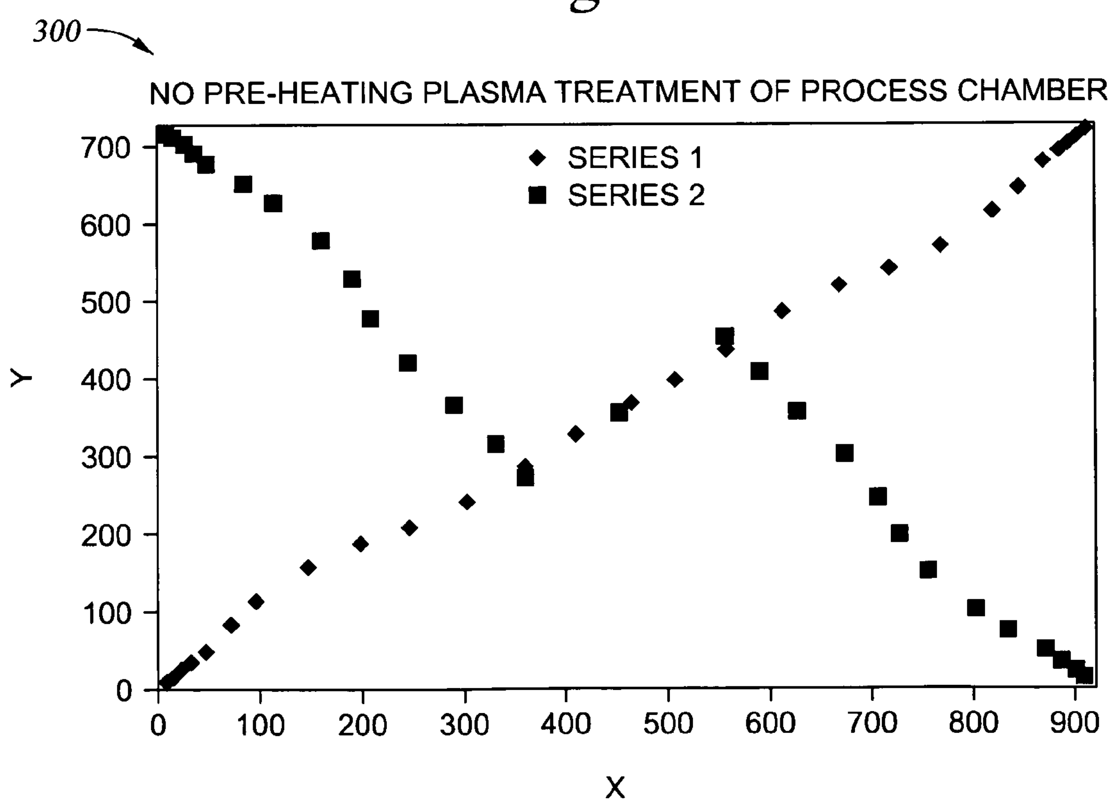
FIG. 3A is a chart showing the location of $SiO_x$ film thickness measurements which were made to determine film deposition rate and film uniformity across a 730 mm×920 mm glass substrate.
Figure 3B:
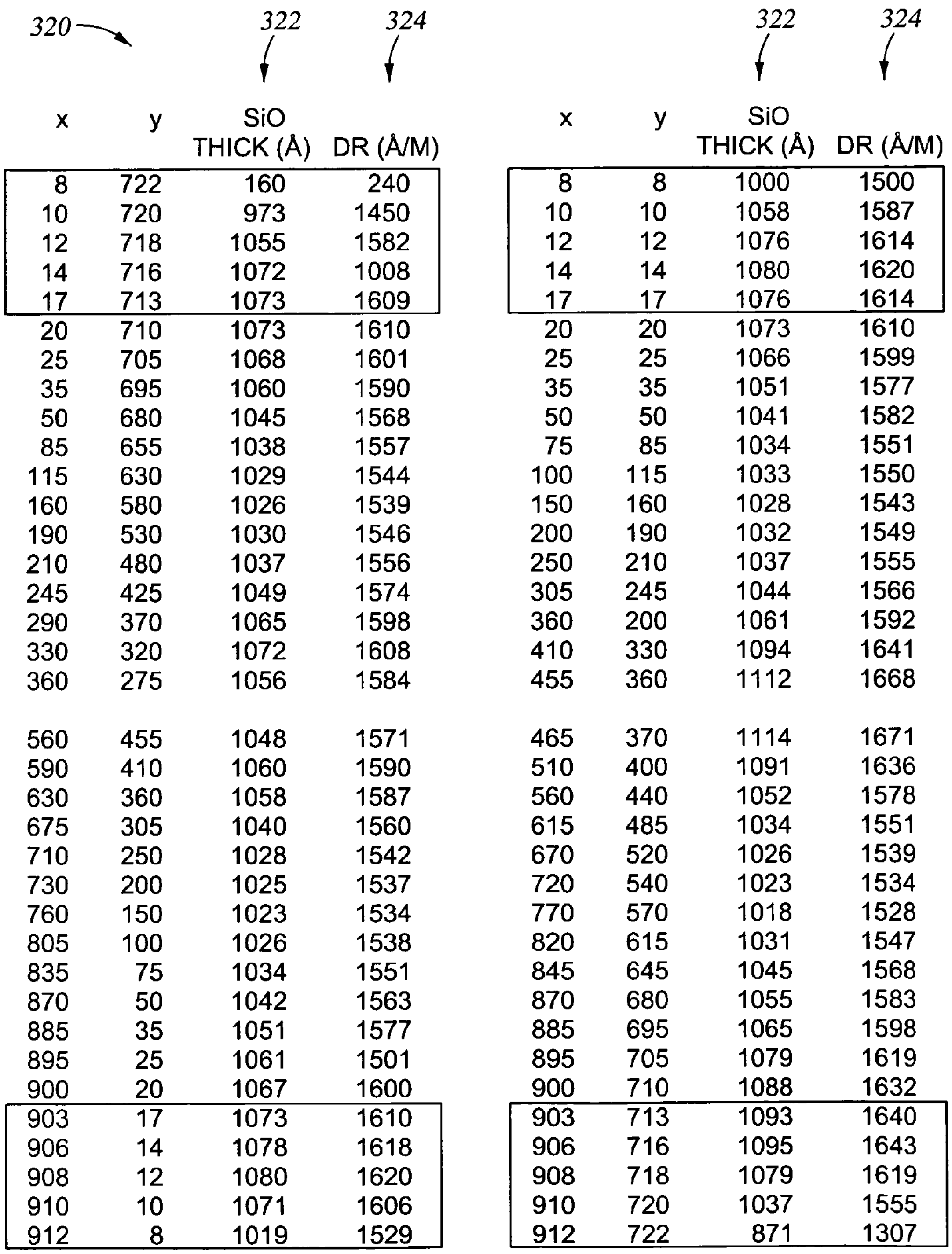
FIG. 3B is a table 320 showing the measured $SiO_x$ thickness 322, in Å, of PECVD films deposited by the method of the invention which correlate to the x and y locations in mm shown on the FIG. 3A chart. The table also shows a deposition rate 324 (DR) for the film at each of the locations for which a film thickness is provided.

FIG. 2A shows a graph 200 where the substrate run number is on axis 202, the deposition rate of $SiO_x$ in Å/min is on axis 204, and curve 206 shows the increasing deposition rate as the number of substrates processed in sequence increases. The variation in the data is related to the heating elements in the substrate support platform coming off and on. However, the trend as illustrated by curve 206 shows the constant increase in deposition rate of the $SiO_x$ film during the sequential processing of a series of substrates. After deposition of the $SiO_x$ film, each substrate surface was measured using an ellipsometer in a pattern which is shown in FIG. 3A. The average $SiO_x$ deposition rate was calculated for each substrate based on the average film thickness measurement. The data which correlates to the graph 200 plotted in FIG. 2A is presented in the Table 320 shown in FIG. 3B, with reference to the x axis and y axis coordinates from the FIG. 3A pattern. The average deposition rate (DR) is shown at 324, with the average $SiO_x$ film thickness shown at 322. The data in the boxes shown in FIG. 3B was not used in the calculation of average film thickness or average deposition rate, as this data was affected by edge effects.

The film deposition rate and thickness uniformity data which correlates with the graph shown in FIG. 2A is shown in Table 1 which follows herein. The average deposition rate increase between substrate number 1 and substrate number 10 was 5.4%.

With reference to FIG. 2B, the ten substrates to which a $SiO_x$ film was applied by PECVD were processed with the benefit of a single plasma pre-heating of the process volume surrounding structures which was carried out prior to deposition of the $SiO_x$ film on the first substrate. Each of the ten substrates was processed in sequence without any cleaning of the process chamber. The pre-heating of the process volume surrounding structures was as follows: An argon plasma was applied to the process volume surrounding structures for a time period of 5 minutes prior to introduction of the preheated substrate into the PECVD processing chamber. The power applied to the gas distribution plate 118 was 600 W, the pressure in the process chamber was 1.5 Torr, the spacing "d" was 1500 mils, and the argon flow rate was 3 slm. The estimated temperature of the process volume structures was in the range of about 390° C. The process conditions under which the $SiO_x$ film was deposited were the same as reported for the previous example.

FIG. 2B shows a graph 220, where the substrate run number is on axis 222, the deposition rate of $SiO_x$ in Å/min is on axis 224, and curve 226 shows the increasing deposition rate as the number of substrates processed in sequence increases. After deposition of the $SiO_x$ film, each substrate surface was measured using an ellipsometer in a pattern which is shown in FIG. 3A. The average $SiO_x$ deposition rate was calculated for each substrate based on the average film thickness measurement for that substrate, in the manner described with respect to the previous example.

The film deposition rate and thickness uniformity data which correlates with the graph shown in FIG. 2B is shown in Table 2 which follows herein. The average deposition rate increase between substrate number 1 and substrate number 10 was 3.8%.

With reference to FIG. 2C, the ten substrates to which a $SiO_x$ film was applied by PECVD were processed with the benefit of a plasma pre-heating of the process volume surrounding structures which was carried out prior to deposition of the $SiO_x$ film for each of the ten substrates processed. Each of the ten substrates was processed in sequence without any cleaning of the process chamber. An argon plasma was applied to the process volume surrounding structures for a time period of five minutes prior to introduction of the first pre-heated substrate into the processing chamber. The time period of plasma treatment was reduced to one minute for the remaining nine substrates in the interest of reducing processing time. The power applied to the gas distribution plate 118 was 600 W, the pressure in the process chamber was 1.5 Torr, the spacing "d" was 1500 mils, and the argon flow rate was 3 slm. The temperature of the process chamber liner 190 and shower head 118 after this treatment was estimated to be about 390° C. The process conditions under which the $SiO_x$ film was deposited were the same as reported with respect to the previous two examples.

FIG. 2C shows a graph 230, where the substrate run number is on axis 232, the deposition rate of $SiO_x$ in Å/min is on axis 234, and curve 236 shows the increasing deposition rate as the number of substrates processed in sequence increases. After deposition of the $SiO_x$ film, each substrate surface was measured using an ellipsometer in a pattern which is shown in FIG. 3A. The average $SiO_x$ deposition rate was calculated for each substrate based on the average film thickness measurement for that substrate, in the manner described with respect to the previous examples.

The film deposition rate and thickness uniformity data which correlates with the graph shown in FIG. 2C is shown in Table 3 which follows herein. The average deposition rate increase between substrate number 1 and substrate number 10 was 3.4%.

TABLE 1

| Run | DR/20 mm | Unif/10 mm | 12 mm | 14 mm | 17 mm | 20 mm | 25 mm | 35 mm | 50 mm | MAX | min |
|---|---|---|---|---|---|---|---|---|---|---|---|
| No-1 | 1576 | 6.8% | 4.5% | 4.5% | 4.5% | 4.5% | 4.5% | 4.5% | 4.5% | 1671 | 1528 |
| No-2 | 1601 | 6.6% | 5.2% | 4.4% | 4.4% | 4.4% | 4.4% | 4.4% | 4.4% | 1699 | 1556 |
| No-3 | 1606 | 4.3% | 4.3% | 4.3% | 4.3% | 4.3% | 4.3% | 4.3% | 4.3% | 1699 | 1558 |
| No-4 | 1604 | 5.0% | 4.5% | 4.5% | 4.5% | 4.5% | 4.5% | 4.5% | 4.5% | 1703 | 1557 |
| No-5 | 1620 | 4.2% | 4.2% | 4.2% | 4.2% | 4.2% | 4.2% | 4.2% | 4.2% | 1713 | 1573 |
| No-6 | 1619 | 5.4% | 4.3% | 4.3% | 4.3% | 4.3% | 4.3% | 4.3% | 4.3% | 1716 | 1574 |
| No-7 | 1635 | 5.6% | 4.4% | 4.4% | 4.4% | 4.4% | 4.4% | 4.4% | 4.4% | 1739 | 1593 |
| No-8 | 1662 | 4.4% | 3.9% | 3.9% | 3.9% | 3.9% | 3.9% | 3.9% | 3.9% | 1748 | 1618 |
| No-9 | 1661 | 5.2% | 3.9% | 3.9% | 3.9% | 3.9% | 3.9% | 3.9% | 3.9% | 1743 | 1612 |
| No-10 | 1661 | 4.8% | 4.3% | 4.3% | 4.3% | 4.3% | 4.3% | 4.3% | 4.3% | 1760 | 1616 |

TABLE 2

| Run | DR/20 mm | Unif/10 mm | 12 mm | 14 mm | 17 mm | 20 mm | 25 mm | 35 mm | 50 mm | MAX | min |
|---|---|---|---|---|---|---|---|---|---|---|---|
| Ar-1 | 1692 | 7.4% | 4.5% | 4.5% | 4.5% | 4.5% | 4.5% | 4.5% | 4.5% | 1781 | 1628 |
| Ar-2 | 1661 | 52.5% | 4.4% | 4.4% | 4.4% | 4.4% | 4.4% | 4.4% | 4.4% | 1747 | 1599 |
| Ar-3 | 1671 | 11.2% | 4.0% | 4.0% | 4.0% | 4.0% | 4.0% | 4.0% | 4.0% | 1753 | 1619 |
| Ar-4 | 1695 | 13.6% | 4.3% | 4.3% | 4.3% | 4.3% | 4.3% | 4.3% | 4.3% | 1783 | 1637 |
| Ar-5 | 1702 | 7.6% | 3.9% | 3.9% | 3.9% | 3.9% | 3.9% | 3.9% | 3.9% | 1783 | 1649 |
| Ar-6 | 1713 | 9.6% | 3.9% | 3.9% | 3.9% | 3.9% | 3.9% | 3.9% | 3.9% | 1796 | 1663 |
| Ar-7 | 1714 | 5.2% | 4.1% | 4.1% | 4.1% | 4.1% | 4.1% | 4.1% | 4.1% | 1795 | 1654 |
| Ar-8 | 1700 | 58.3% | 4.2% | 4.2% | 4.2% | 4.2% | 4.2% | 4.2% | 4.2% | 1780 | 1637 |
| Ar-9 | 1725 | 45.5% | 4.0% | 4.0% | 4.0% | 4.0% | 4.0% | 4.0% | 4.0% | 1803 | 1666 |
| Ar-10 | 1716 | 6.2% | 3.9% | 3.9% | 3.9% | 3.9% | 3.9% | 3.9% | 3.9% | 1796 | 1662 |

TABLE 3

| Run | DR/20 mm | Unif/10 mm | 12 mm | 14 mm | 17 mm | 20 mm | 25 mm | 35 mm | 50 mm | MAX | min |
|---|---|---|---|---|---|---|---|---|---|---|---|
| Ar-11 | 1661 | 3.8% | 3.5% | 3.5% | 3.5% | 3.5% | 3.5% | 3.5% | 3.5% | 1736 | 1619 |
| Ar-12 | 1671 | 3.5% | 3.5% | 3.5% | 3.5% | 3.5% | 3.5% | 3.5% | 3.5% | 1744 | 1628 |
| Ar-13 | 1715 | 5.0% | 3.2% | 3.2% | 3.2% | 3.2% | 3.2% | 3.2% | 3.2% | 1787 | 1677 |
| Ar-14 | 1718 | 3.9% | 3.5% | 3.5% | 3.5% | 3.5% | 3.5% | 3.5% | 3.5% | 1797 | 1676 |
| Ar-15 | 1716 | 2.7% | 2.7% | 2.7% | 2.7% | 2.7% | 2.7% | 2.7% | 2.7% | 1780 | 1685 |
| Ar-16 | 1716 | 2.8% | 2.7% | 2.7% | 2.7% | 2.7% | 2.7% | 2.7% | 2.7% | 1777 | 1684 |
| Ar-17 | 1703 | 3.5% | 2.8% | 2.8% | 2.8% | 2.8% | 2.8% | 2.8% | 2.8% | 1770 | 1674 |
| Ar-18 | 1688 | 5.5% | 4.1% | 3.6% | 3.6% | 3.6% | 3.6% | 3.6% | 3.6% | 1766 | 1645 |
| Ar-19 | 1691 | 2.7% | 2.6% | 2.6% | 2.6% | 2.6% | 2.6% | 2.6% | 2.6% | 1753 | 1664 |
| Ar-20 | 1688 | 4.9% | 3.0% | 2.8% | 2.8% | 2.8% | 2.8% | 2.8% | 2.8% | 1751 | 1655 |

In a first embodiment of the invention, we discovered that pre-heating at least one processing volume surrounding structure prior to CVD or PECVD deposition of a film (when a series of substrates which are sequentially processed in the same processing chamber), significantly improves the constancy of film deposition rate and improves film uniformity across a substrate. This improvement can be used to increase the throughput of substrates and to increase production yield.

In a second embodiment of the invention, we solved a problem related to controlling the average film thickness from substrate to substrate immediately after wet cleaning (or reactive plasma cleaning) of the film deposition chamber. As is apparent from review of the data in Tables 1 through 3, there is a significant increase in the film deposition rate between the first substrate and the fourth or fifth substrate processed. After this, the film deposition rate generally levels out. We were able to compensate for this deposition rate increase for the first few samples by developing a device-controlled (such as computer-controlled) method of adjusting the film deposition time during processing of the first few substrates. Typically, adjustment of the deposition time for the first four to five substrates is sufficient, not by way of limitation, so that the film thickness deposited is consistent from substrate to substrate throughout the entire series of substrates processed.

Figure 4A:
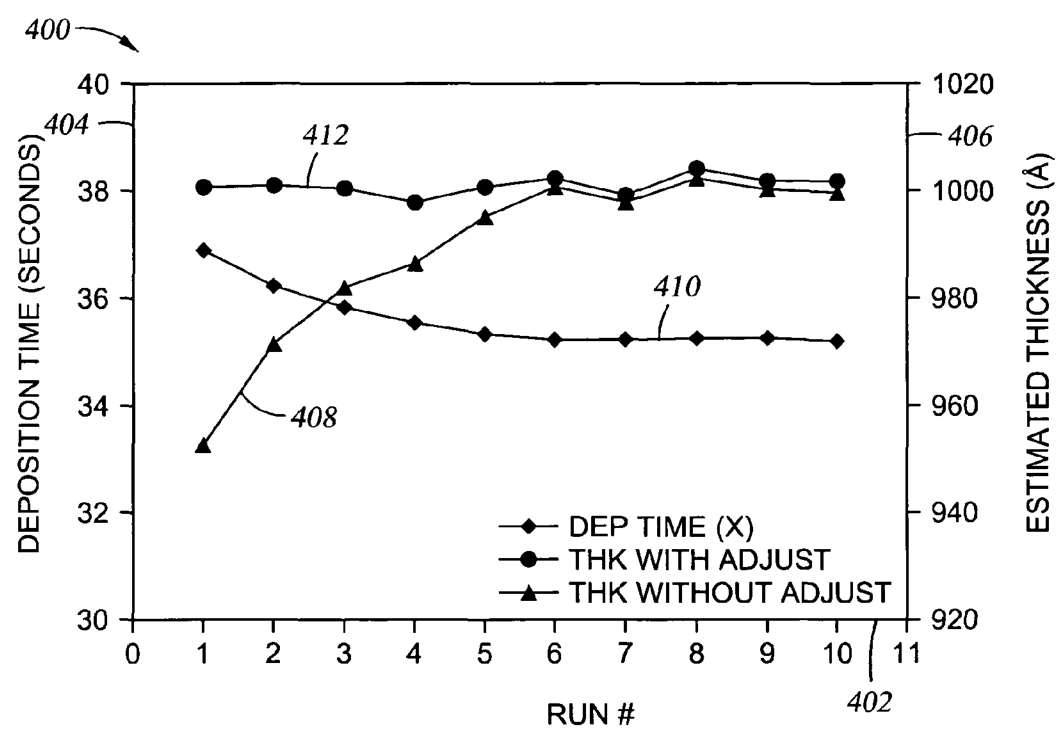
FIG. 4A is a graph a 400 showing data for a series of sequentially processed substrates, where the substrate number (run number) is shown on the axis 402; the deposition time, in seconds is shown on the axis 404; and the estimated thickness (average based on deposition rate) of the film in Å is shown on axis 406. Curve 408 shows the film thickness when there is no adjustment of deposition time from substrate to substrate during processing of the series of substrates. Curve 412 shows the film thickness when software is used to control the deposition time for the first 5 substrates processed.

FIG. 4A is a graph a 400 showing data for a series of sequentially processed substrates, where the substrate number (run number) is shown on the axis 402; the deposition time, in seconds is shown on the axis 404. The estimated average film thickness in Å is shown on axis 406. Curve 408 shows the average film thickness when there is no adjustment of deposition time from substrate to substrate during processing of the series of substrates. Curve 410 shows the deposition time required to reach a consistent film thickness based on Curve 408. Curve 412 shows the film thickness when software is used to control the deposition time for the first 5 substrates processed.

FIG. 4B is a table 420 showing supporting data for the graph shown in FIG. 4A. Based on the data, which was obtained empirically, a representative algorithm 422 was developed which may be used to set the deposition time period for a series of sequentially processed substrates when PECVD deposition of a $SiO_x$ film is carried out using a TEOS precursor. This representative algorithm is programmed into a control system used to control the film deposition time, for example (and not by way of limitation), of the first five substrates processed. One skilled in the art, in view of the disclosure herein can make a similar determination of an algorithm which is applicable for different processing conditions and/or for a different processing apparatus empirically and then apply the algorithm in the form of software which is used to control the deposition time for the first few substrates processed.

A combination of the repeatable deposition rate with deposition time adjustment has enabled a large increase in the number of substrates which may be processed prior to cleaning the film deposition chamber, while providing increased control over film thickness and uniformity of the deposited film. The method enables processing of at least 10 substrates, and typically substantially more than 10 in series prior to cleaning of the deposition chamber using a chemically reactive plasma treatment or a wet cleaning process.

Various modifications and alterations of the invention will become apparent to those skilled in the art, where such modifications do not depart from the spirit and scope of the invention, which is defined by the accompanying claims.

We claim:

1. A method of controlling the average film thickness of a silicon oxide film deposited over a substrate having an area of at least 6,000 square centimeters, when a plurality of substrates are processed sequentially in a deposition chamber, comprising:

a) depositing a nominal film thickness of said silicon oxide film over the surface of each of a first plurality of substrates which are sequentially processed in said deposition chamber, using a constant film deposition time period for each substrate;

b) empirically determining an average film thickness for each of said first plurality of substrates;

c) using said empirical film thickness data gathered from said first plurality of sequentially processed substrates to develop an algorithm based on a difference in average film thickness for each substrate in said first plurality of substrates, where the algorithm is a function of the substrate number in the sequence of substrates within said first plurality of substrates, and where the substrate average film thickness values used to develop the algorithm are limited to average film thicknesses where there is a trend toward increasing film thickness; and d) incorporating said algorithm into software which is used to control film deposition time period for a subsequently processed plurality of substrates which are sequentially processed, in a manner which maintains a consistent average film thickness during processing of at least 10 substrates.

2. A method in accordance with claim 1, wherein said silicon oxide film is deposited using plasma enhanced chemical vapor deposition.

3. A method in accordance with claim 2, wherein said silicon oxide film is deposited from a film forming gas mixture which includes TEOS.

4. A method of improving uniformity of the chemical vapor deposition of silicon oxide films when a plurality of substrates are processed sequentially in a deposition chamber, comprising:

a) pre-heating a substrate support platform within said deposition chamber;

b) pre-heating at least one processing volume structure which surrounds a substrate when said substrate is present on said substrate support platform, wherein said at least one processing volume structure is selected from the group consisting of side wall structures, structures which overlie said substrate when present, and insert structures which are adjacent to said substrate, and wherein said pre-heating of said at least one processing volume structure is achieved using physical bombardment by high energy species of a plasma;

c) transferring a substrate into said deposition chamber so that said substrate resides on said support platform which has been pre-heated;

d) depositing a silicon oxide film over a surface of said substrate;

e) removing said substrate having said deposited silicon oxide film from said deposition chamber;

f) repeating steps c) through e) for a first plurality of substrates;

g) empirically determining an average film thickness for each of said first plurality of substrates;

h) using said empirical film thickness data gathered from said first plurality of substrates to develop an algorithm based on a difference in average film thickness for each substrate in said first plurality of substrates, wherein the algorithm is a function of the substrate number in the sequence of substrates within said first plurality of substrates, and where the substrate average film thickness values used to develop the algorithm are limited to average film thicknesses where there is a trend toward increasing film thickness; and i) incorporating said algorithm into software which is used to control a film deposition time period for a subsequently processed plurality of substrates which are sequentially processed, in a manner which maintains a consistent average film thickness during processing of at least 10 substrates.

5. A method in accordance with claim 4, wherein said method includes an additional step in which said substrate is pre-heated prior to placement on said pre-heated substrate support platform.

6. A method in accordance with claim 4, wherein said pre-heating of said at least one processing volume structure is carried out after transferring a substrate into said processing chamber.

7. A method in accordance with claim 4, wherein a plasma source gas for pre-heating of said at least one processing volume structure includes oxygen.

* * * * *